(12) United States Patent
Takisawa et al.

(10) Patent No.: US 6,309,505 B1
(45) Date of Patent: Oct. 30, 2001

(54) SUBSTRATE PROCESSING APPARATUS AND METHOD

(75) Inventors: Toru Takisawa; Takao Yonehara, both of Atsugi; Kenji Yamagata, Sagamihara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/037,479

(22) Filed: Mar. 10, 1998

(30) Foreign Application Priority Data

Mar. 13, 1997 (JP) .................................................. 9-059464

(51) Int. Cl.[7] .................................................. B65G 49/07
(52) U.S. Cl. .......................... 156/285; 29/743; 156/228; 156/556; 156/580; 156/583.3; 294/64.1
(58) Field of Search .................................... 156/160, 228, 156/580, 583.3, 102, 285, 556; 29/743; 294/64.1

(56) References Cited

U.S. PATENT DOCUMENTS

| 3,720,555 | * | 3/1973 | Ceppi ................................... 156/102 |
| 3,842,567 | * | 10/1974 | Zwart et al. ...................... 156/102 X |
| 4,370,194 | * | 1/1983 | Shaver et al. ..................... 156/102 X |
| 4,457,662 | * | 7/1984 | Ireland et al. ........................ 414/331 |
| 4,724,023 | * | 2/1988 | Marriott ............................... 156/102 |
| 5,427,973 | | 6/1995 | Satoh et al. . |
| 5,494,546 | * | 2/1996 | Horvath ............................... 156/102 |

FOREIGN PATENT DOCUMENTS

| 0 256 150 A1 | 8/1986 | (EP) . |
| 1-135439 | 5/1989 | (JP) . |

OTHER PUBLICATIONS

Austrian Search Report dated Feb. 4, 1999.
English Abstract of JP 01–135439.
Australian Office Action dated Jun. 5, 2000.

\* cited by examiner

Primary Examiner—Robert R. Koehler
(74) Attorney, Agent, or Firm—Morgan&Finnegan, LLP (57) ABSTRACT

One wafer is placed on a wafer support table with its frontside facing upward, and the other wafer is chucked by a wafer chuck portion with its frontside facing upward. The wafer chuck portion is pivoted about a shaft through about 180° to make the two wafers face each other substantially parallel. In response to the cancel of the chucking of the upper wafer by the wafer chuck portion, the central portion of the upper wafer is pressed by a press pin to superimpose the two wafers.

19 Claims, 12 Drawing Sheets

SUBSTRATE PROCESSING APPARATUS AND METHOD

BACKGROUND OF THE INVENTION

1. Field of the Invention

The present invention relates to a substrate processing apparatus and method and a substrate manufacturing method and, more particularly, to a substrate processing apparatus and method for overlapping and contacting two substrates, and a substrate manufacturing method.

2. Description of the Related Art

Two wafers (substrates) are brought into contact with each other, and superimposed to each other by performing anode joining, press processing, annealing, or the like. This method is suitable for manufacturing a wafer having an SOI structure or the like.

Figure 11A:
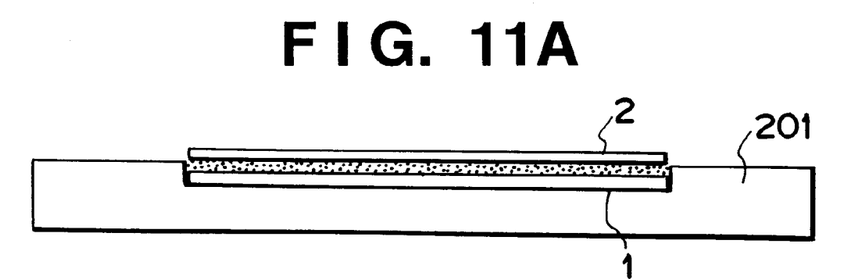
FIGS. 11A and 11B are views showing the steps of a wafer adhering method.
Figure 11B:
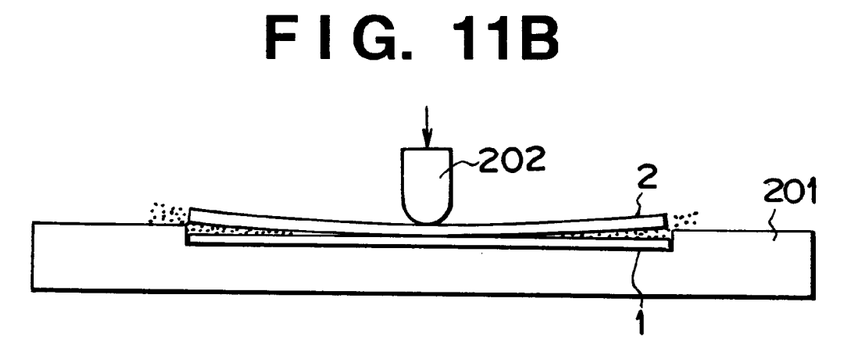

FIGS. 11A and 11B are schematic views showing steps in a process of contacting wafers. In this wafer contact, as shown in FIG. 11A, a first wafer 1 is set on a wafer support jig 201 with its contact surface facing upward, and a second wafer 2 is softly overlapped on the first wafer 1 with its contact surface facing downward. At this time, the upper wafer 2 floats by a gas (e.g., air or inert gas) between the wafers, as shown in FIG. 11A.

Before the gas between the wafers 1 and 2 is completely discharged, the central portion of the upper wafer 2 is pressed by a press pin 202, as shown in FIG. 11B. Then, the gas between the central portions of the wafers is discharged, and the wafers 1 and 2 contact to each other at the central portion. As the gas between the wafers are gradually discharged toward the peripheral portion, the area of the contact portion increases. Finally, the entire wafers contact to each other.

This method is useful for contacting two wafers without remaining any gas between them, but has the following problems.

The first problem is contamination of the wafers along with alignment of the two wafers. That is, since the upper wafer 2 overlapped floats by the gas between the wafers, the friction of the upper wafer 2 in horizontal movement is very small. For this reason, the upper wafer 2 slips even with a slight inclination of the jig 201. Accurately aligning the two wafers 1 and 2 therefore requires a means for restricting the horizontal movement of the wafer 2.

Figure 12:
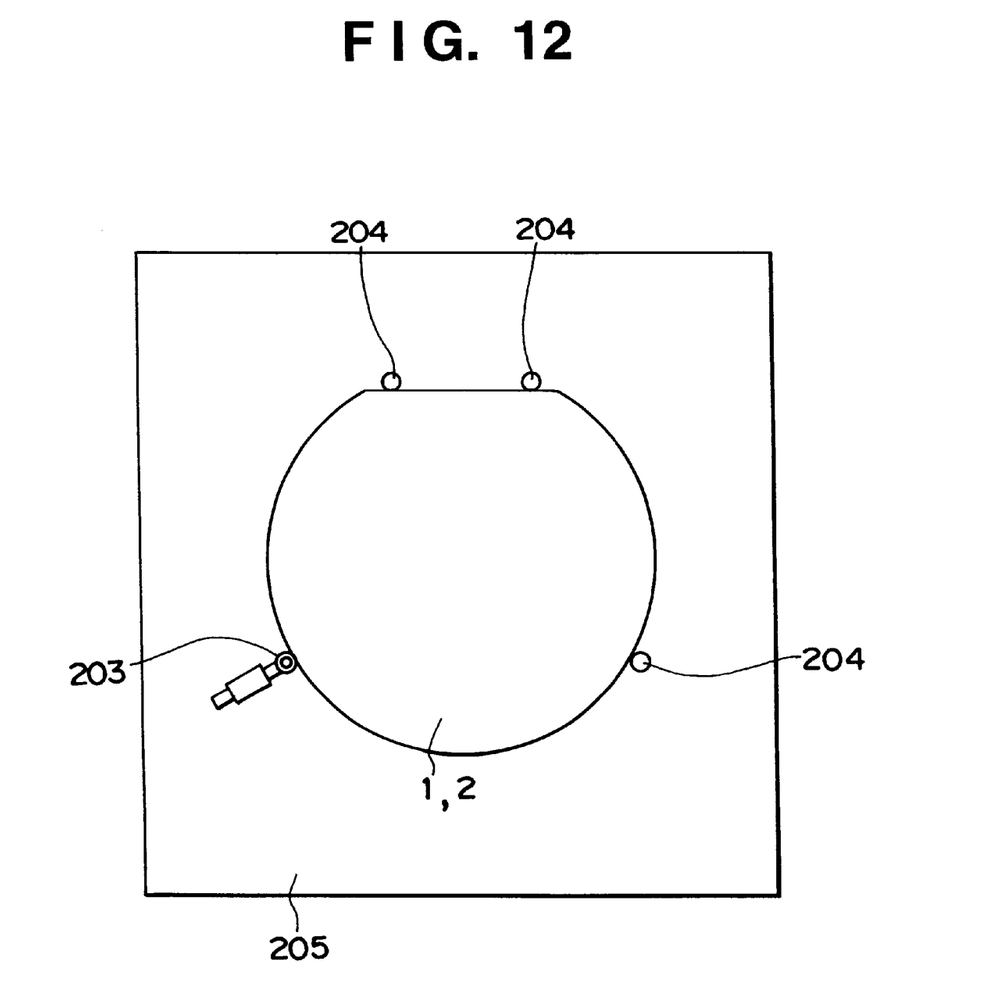
FIG. 12 is a view showing another example of the arrangement of a jig.

The jig 201 shown in FIGS. 11A and 11B has a recess which coincides with the shapes of the wafers 1 and 2, and aligns the wafers 1 and 2 while restricting the horizontal movement of the wafers 1 and 2 by the sides walls of this recess. FIG. 12 is a view showing another example of the arrangement of the jig for overlapping the wafers 1 and 2 while aligning them. A jig 205 has a plurality of aligning pins 204 and a press pin 203. The press pin 203 presses the wafers 1 and 2 against the plurality of aligning pins 204 to restrict the horizontal movement of the wafers 1 and 2.

In the method of overlapping the two wafers using the jig shown in FIGS. 11A and 11B or FIG. 12, since the peripheral portion of the wafer is brought into contact with the jig, particles may be produced, the peripheral portion of the wafer may be damaged, and the yield may decrease.

Another problem is posed by variations in wafer press conditions. More specifically, the time interval between overlapping of two wafers and pressing of them by the press pin changes, and the gap between the wafers in pressing the wafers by the press pin varies. Therefore, the quality of the wafer obtained by contacting the two wafers is difficult to be made uniform. The gas between the wafers may be partially discharged before the wafers are pressed by the press pin. In this case, the gas may remain between the wafers because the wafers cannot be contacted while the gas is gradually discharged from the central portion toward the peripheral portion.

SUMMARY OF THE INVENTION

The present invention has been made in consideration of the above problems, and has as its object to increase the quality of a substrate obtained by adhering two substrates.

A substrate processing apparatus according to the present invention is a substrate processing apparatus for overlapping and contacting two substrates, characterized by comprising substrate operation means for supporting the two substrates to face each other, and then canceling the support of one substrate, and press means for pressing part of a backside of one substrate in response to the cancel of the support of one substrate by the substrate operation means to superimpose one substrate on the other substrate.

In the substrate processing apparatus, the press means preferably presses part of one substrate at substantially the same time as the cancel of the support of one substrate by the substrate operation means.

The applied pressure is preferably about 150 to 300 gf and more preferably about 200 to 250 gf.

In the substrate processing apparatus, the press means preferably presses part of one substrate before a gas between the two substrates is discharged by not less than a predetermined amount after the cancel of the support of one substrate by the substrate operation means.

In the substrate processing apparatus, the press means preferably presses part of one substrate upon lapse of a predetermined time after the cancel of the support of one substrate by the substrate operation means.

In the substrate processing apparatus, the press means preferably presses part of one substrate before a distance between the two substrates decreases to not more than a predetermined distance after the cancel of the support of one substrate by the substrate operation means.

In the substrate processing apparatus, the substrate operation means preferably substantially horizontally supports the two substrates, and then cancel the support of the upper substrate.

In the substrate processing apparatus, the substrate operation means preferably substantially horizontally supports the two substrates and then cancels the support of the upper substrate, and the press means preferably presses part of the upper substrate before a gas between the two substrates is discharged by not less than a predetermined amount owing to a weight of the upper substrate after the cancel of the support of the upper substrate by the substrate operation means.

In the substrate processing apparatus, the substrate operation means preferably supports the two substrates respectively from only backsides.

In the substrate processing apparatus, the substrate operation means preferably comprises gap adjustment means for adjusting a gap between the two substrates immediately before the support of one substrate is canceled.

This gap is preferably about 20 to 100 mm and more preferably about 30 to 60 mm.

In the substrate processing apparatus, the gap adjustment means preferably adjusts the gap between the two substrates to a predetermined distance.

In the substrate processing apparatus, the gap adjustment means preferably comprises measurement means for measuring thicknesses of the two substrates, and adjusts the gap between the two substrates on the basis of measurement results.

In the substrate processing apparatus, the press means preferably comprises a pressure transfer member for pressing the substrate in contact with part of the substrate, and vibration means for vibrating the pressure transfer member.

In the substrate processing apparatus, the vibration means preferably vibrates the pressure transfer member in pressing the substrate.

In the substrate processing apparatus, the substrate operation means preferably comprises first substrate support means for supporting one substrate with a frontside of the substrate facing upward, and second substrate support means for chucking the other substrate from a backside, and supporting the substrate while making a frontside of the substrate face the frontside of one substrate substantially parallel.

In the substrate processing apparatus, the second substrate support means preferably comprises a chuck member for chucking the other substrate from the backside, and after the other substrate is chucked by the chuck member, preferably pivots the chuck member through about 180° about a shaft arranged near a middle portion between the chuck member and the first substrate support means to turn over the other substrate chucked and make the other substrate face one substrate supported by the first substrate support means.

The substrate processing apparatus preferably further comprises substrate convey means for conveying the substrates to reception positions of the substrates by the substrate operation means.

The substrate processing apparatus preferably further comprises substrate adjustment means for adjusting central positions and directions of the substrates supported by the substrate operation means.

In the substrate processing apparatus, the substrate adjustment means preferably adjusts the central positions and directions of the substrates held by the substrate convey means, and then the substrate convey means preferably conveys the substrates having the adjusted central positions and directions to the reception positions.

A substrate processing method according to the present invention is a substrate processing method of overlapping and contacting two substrates, characterized by comprising supporting the two substrates to face each other, then canceling the support of one substrate, pressing part of a backside of one substrate in response to the cancel, and superimposing one substrate on the other substrate.

A substrate processing method according to the present invention is a substrate processing method of overlapping and contacting two substrates, characterized by comprising supporting the two substrates to face each other, then canceling the support of one substrate, pressing part of a backside of one substrate at substantially the same time as the cancel, and superimposing one substrate on the other substrate.

A substrate processing method according to the present invention is a substrate processing method of overlapping and contacting two substrates, characterized by comprising supporting the two substrates to face each other, then canceling the support of one substrate, pressing part of a backside of one substrate before a gas between the two substrates is discharged by not less than a predetermined amount, and superimposing one substrate on the other substrate.

A substrate processing method according to the present invention is a substrate processing method of overlapping and contacting two substrates, characterized by comprising supporting the two substrates to face each other, then canceling the support of one substrate, pressing part of a backside of one substrate upon lapse of a predetermined time, and superimposing one substrate on the other substrate.

A substrate processing method according to the present invention is a substrate processing method of overlapping and contacting two substrates, characterized by comprising supporting the two substrates to face each other, then canceling the support of one substrate, pressing part of a backside of one substrate before a distance between the two substrates decreases to not more than a predetermined distance, and superimposing one substrate to the other substrate.

A substrate processing method according to the present invention is a substrate processing method of overlapping and contacting two substrates, characterized by comprising substantially horizontally supporting the two substrates to face each other, then canceling the support of the upper substrate, pressing part of the upper substrate in response to the cancel, and to superimposing the upper substrate on the lower substrate.

A substrate processing method according to the present invention is a substrate processing method of overlapping and contacting two substrates, characterized by comprising substantially horizontally supporting the two substrates to face each other, then canceling the support of the upper substrate, pressing part of the upper substrate before a gas between the two substrates is discharged by not less than a predetermined amount owing to a weight of the upper substrate, and superimposing the upper substrate on the lower substrate.

In each substrate processing method, the two substrates are preferably respectively supported from only backsides.

In each substrate processing method, a gap between the two substrates immediately before the support of the substrate is canceled is preferably adjusted to a predetermined distance.

Further objects, features and advantages of the present invention will become apparent from the following detailed description of embodiments of the present invention with reference to the accompanying drawings.

BRIEF DESCRIPTION OF THE DRAWINGS

FIGS. 10A to 10F are views showing an example of a process of manufacturing a wafer having an SOI structure or the like;

DETAILED DESCRIPTION OF THE PREFERRED EMBODIMENTS

Figure 1:
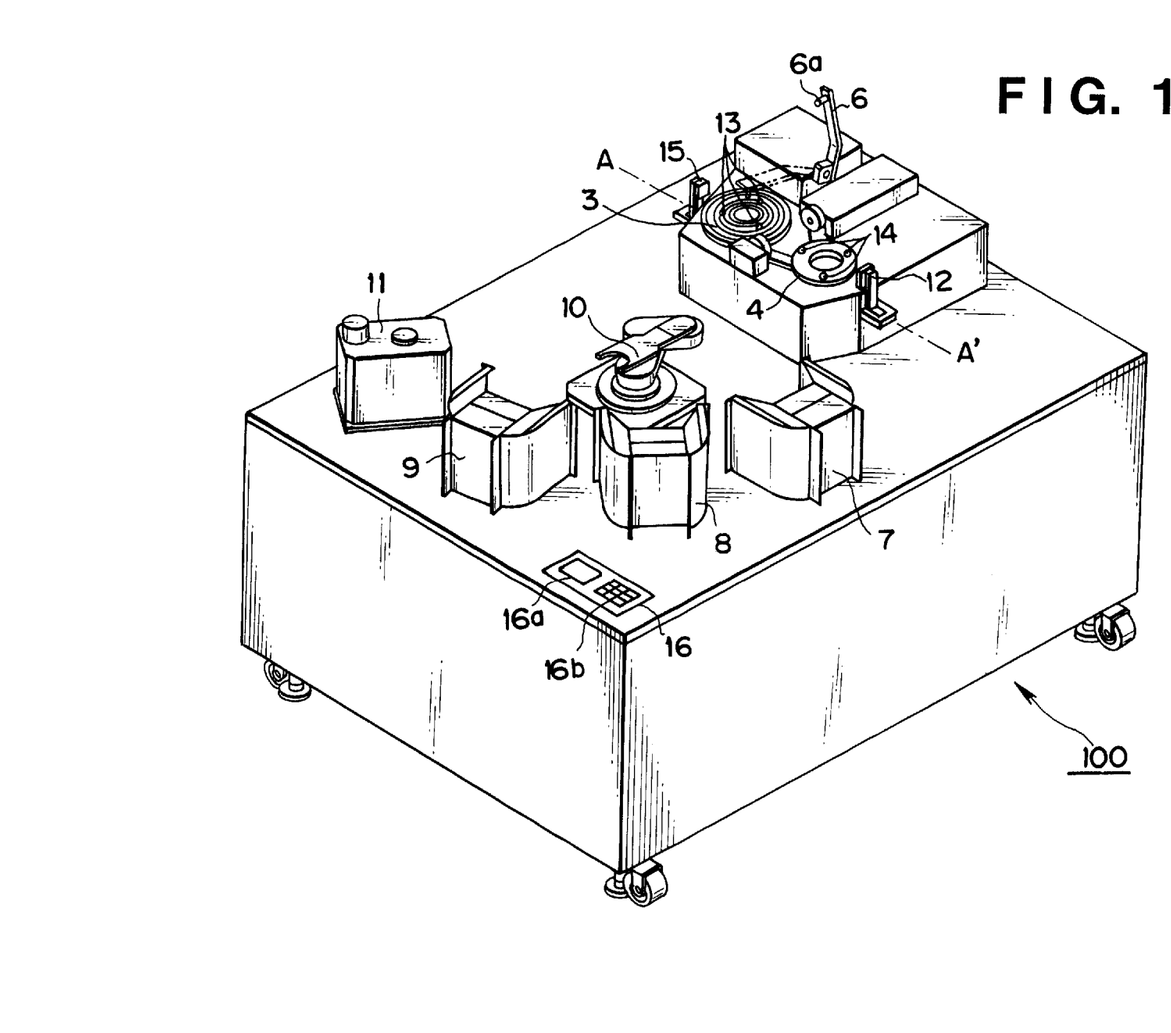
FIG. 1 is a perspective view schematically showing the whole arrangement of a wafer processing apparatus according to a preferred embodiment of the present invention.
Figure 2:
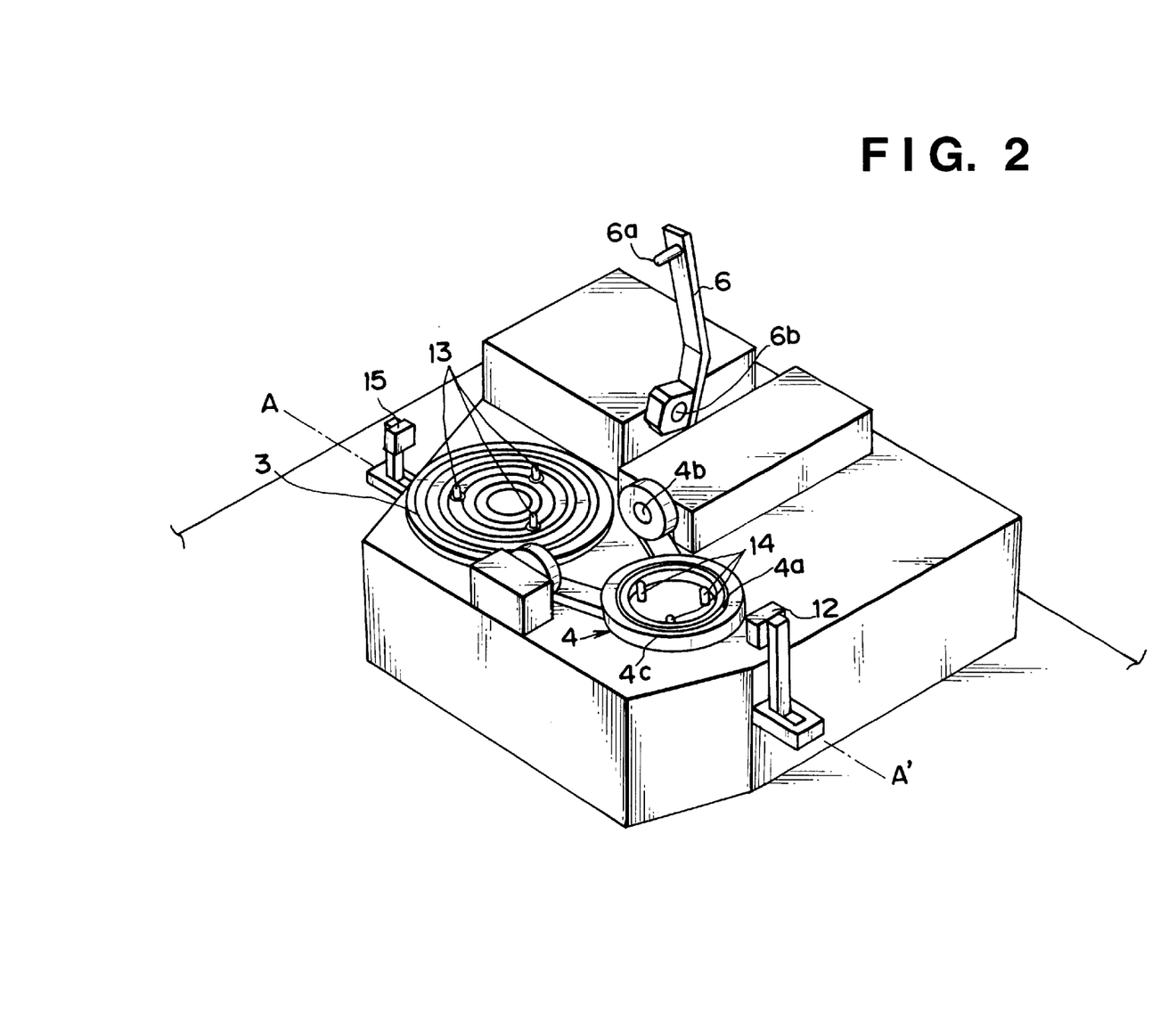
FIG. 2 is a partial enlarged view of the wafer processing apparatus in FIG. 1.

The arrangement of a wafer processing apparatus according to a preferred embodiment of the present invention will be described below with reference to the accompanying drawings. FIG. 1 is a perspective view schematically showing the whole arrangement of the wafer processing apparatus according to this embodiment. FIG. 2 is a partial enlarged view of the wafer processing apparatus in FIG. 1. FIGS. 3 to 7 are sectional views of a wafer processing apparatus 100 shown in FIGS. 1 and 2 taken along the line A–A'. FIGS. 3 to 7 show an operation of adhering two wafers.

The wafer. processing apparatus 100 overlaps and contacting two wafers, and is suitable for, e.g., a method of contacting two wafers to manufacture a wafer having an SOI structure or the like.

The wafer processing apparatus 100 comprises a wafer support table 3 for supporting a first wafer 1 (see FIG. 3) from its backside, and a wafer moving mechanism 4 for chucking a second wafer 2 (see FIG. 3) from its backside and making it face the first wafer 1 substantially parallel.

The wafer support table 3 suitably comes into contact with only the backside of the first wafer 1. This arrangement can prevent the first wafer 1 from being contaminated by particles, and the peripheral portion of the first wafer 1 from damage. The wafer support table 3 desirably comprises a means (e.g., a vacuum chucking mechanism) for preventing the first wafer 1 from moving on the wafer support table 3. This means can prevent misalignment of the two wafers in contacting the two wafers 1 and 2. The surface of the wafer support table 3 is preferably planarized, and its surface flatness is desirably 0.5 mm or less.

The wafer moving mechanism 4 preferably comes into contact with only the backside of the second wafer 2. In this embodiment, the wafer moving mechanism 4 has a groove 4a for vacuum-chucking the wafer. To chuck the second wafer 2, the space in the groove 4a is depressurized. While a wafer chuck portion 4c chucks the backside of the second wafer 2, the wafer moving mechanism 4 pivots about a shaft 4b through about 180° to make the second wafer 2 face the first wafer 1 substantially parallel. The shaft 4b positions at a substantially middle portion between the wafer support table 3 and the wafer chuck portion 4c.

The wafer processing apparatus 100 comprises, as a mechanism for adjusting the gap between the two facing wafers 1 and 2, a displacement detecting portion 15 for measuring the thickness of the first wafer 1 after the first wafer 1 is placed on the wafer support table 3, a displacement detecting portion 12 for measuring the thickness of the second wafer 2 after the second wafer 2 is chucked by the wafer chuck portion 4c, and a z-axis stage 5 (see FIG. 3) for vertically moving the wafer support table 3 on the basis of the measurement results of the two displacement detecting portions 12 and 15 to adjust the gap between the wafers 1 and 2 to a set value.

The wafer processing apparatus 100 has a press mechanism 6 for pressing substantially the central portion of the upper wafer 2 while the two wafers 1 and 2 are supported to face each other. After the two wafers 1 and 2 are supported to face each other, a press pin 6a of the press mechanism 6 pivots about a shaft 6b to a portion near the backside of the upper wafer 2. In response to cancel of the chucking of the upper wafer 2 by the wafer chuck portion 4c of the wafer moving mechanism 4, the press mechanism 6 abuts the press pin 6a against the backside of the upper wafer 2 to press the wafer 2. As the two wafers 1 and 2 are gradually contacted to each other from the pressed portion toward the peripheral portion, the gas between the wafers 1 and 2 is discharged toward the peripheral portion. This prevents the gas from remaining between the wafers 1 and 2. The applied pressure is preferably about 150 to 300 gf and more preferably about 200 to 250 gf.

The press of the wafer 2 by the press pin 6a is preferably performed substantially at the same time as the cancel of the chucking of the wafer 2 by the wafer chuck portion 4c. In this case, since the press operation can start while maintaining the gap between the two wafers 1 and 2 that is adjusted to the set value, the quality of the contacted wafer can be made uniform. In addition, the gas can be more effectively prevented from remaining between the wafers 1 and 2, and misalignment of the wafers 1 and 2 can be prevented.

The press mechanism 6 incorporates a vibrator (e.g., a piezoelectric element) for vibrating the press pin 6a. By vibrating the press pin 6a in pressing the wafer 2, the gas between the wafers 1 and 2 can be efficiently discharged.

The press of the wafer 2 by the press pin 6a may be controlled at another timing. For example, the press pin 6a may press the wafer 2 at a predetermined timing before the gas between the wafers 1 and 2 is discharged by a predetermined amount or more after the chucking of the wafer 2 is canceled. The press pin 6a may press the wafer 2 upon the lapse of a predetermined time after the chucking of the wafer 2 is canceled. The press pin 6a may press the wafer 2 at a predetermined timing before the distance between the wafers 1 and 2 decreases to a predetermined distance or less owing to the weight of the wafer 2 or the like after the chucking of the wafer 2 is canceled.

The wafer processing apparatus 100 further comprises a wafer convey robot 10 for respectively setting the wafers 1 and 2 on the wafer support table 3 and the wafer chuck portion 4c, and receiving the contacted wafer from the wafer support table 3, and a wafer alignment portion 11.

In the wafer processing apparatus 100, before wafer contact process starts, wafer cassettes 7 and 8 for respectively storing unprocessed wafers 1 and 2, and a wafer cassette 9 for storing processed wafers are arranged at predetermined positions. In this embodiment, the unprocessed wafers 1 and 2 are stored in the wafer cassettes 7 and 8 with their backsides facing downward.

When the start of wafer contact process is instructed via an operation switch 16b of an operation panel 16, the wafer convey robot 10 chucks the backside of an unprocessed wafer 1 stored in the wafer cassette 7, and conveys the wafer 1 to the wafer alignment portion 11. The wafer alignment portion 11 senses, with a sensor, the central position and direction (e.g., the positions of an orientation flat and a notch) of the conveyed wafer 1, and adjusts them. The wafer alignment portion 11 preferably comes into contact with only the backside of the wafer 1.

The wafer convey robot 10 receives the wafer 1 having been aligned, and places it at a predetermined position on loading pins 13 projecting from the wafer support table 3. After the wafer 1 is placed on the loading pins 13 in this manner, the wafer support table 3 moves up to support the wafer 1. The central position and direction of the wafer 1 need not be adjusted again on the wafer support table 3 because the wafer 1 has already been aligned by the wafer alignment portion 11 and is transferred to the wafer support table 3 while maintaining the positional relationship. Note that an arrangement of performing alignment of the wafer 1 on the wafer support table 3 can also be employed.

The wafer convey robot 10 extracts an unprocessed wafer 2 from the wafer cassette 8. By the same procedure described above, the central position and direction of the wafer 2 are adjusted by the wafer alignment portion 11, and the wafer 2 is placed at a predetermined position on loading pins 14 projecting from the wafer chuck portion 4c of the wafer moving mechanism 4. After the wafer 2 is placed on the loading pins 14 in this way, the wafer chuck portion 4c pivots about the shaft 4b until it comes into contact with the backside of the wafer 2. The space in the groove 4a is depressurized to chuck the wafer 2 by the wafer chuck portion 4c. Since the wafer 2 has already been aligned by the wafer alignment portion 11 and is chucked by the wafer chuck portion 4c while maintaining the positional relationship, similarly to the wafer 1, the central position and direction of the wafer 2 need not be adjusted again. In chucking the wafer 2, the loading pins 14 may be retracted downward, instead of pivoting the wafer chuck portion 4c.

While the wafers 1 and 2 are respectively supported by the wafer support table 3 and the wafer chuck portion 4c, the displacement detecting portions 15 and 12 respectively measure the thicknesses of the wafers 1 and 2. More specifically, the displacement detecting portions 15 and 12 respectively move sensors 15a and 12a to portions above the wafers 1 and 2, and irradiate, e.g., light on the wafers 1 and 2 to measure the thicknesses of the wafers 1 and 2 based on the reflected light.

After the measurement of the thicknesses of the wafers 1 and 2 completes, the wafer chuck portion 4c pivots about the shaft 4b through about 180° to make the wafer 2 face the wafer 1 substantially parallel, as described above. The gap between the wafers 1 and 2 is adjusted by the z-axis stage 5, and the wafer 2 is pressed by the press pin 6a to contact the wafers 1 and 2.

Upon completion of the contacting, the wafer support table 3 is moved down by the z-axis stage 5, and the processed wafer is supported by the loading pins 13. The wafer convey robot 10 receives the processed wafer and stores it in the wafer cassette 9.

By repeatedly executing this procedure, a plurality of wafers stored in the wafer cassettes 7 and 8 can be successively processed.

The operation of the wafer processing apparatus 100 in contacting two wafers will be described with reference to FIGS. 3 to 7.

Figure 3:
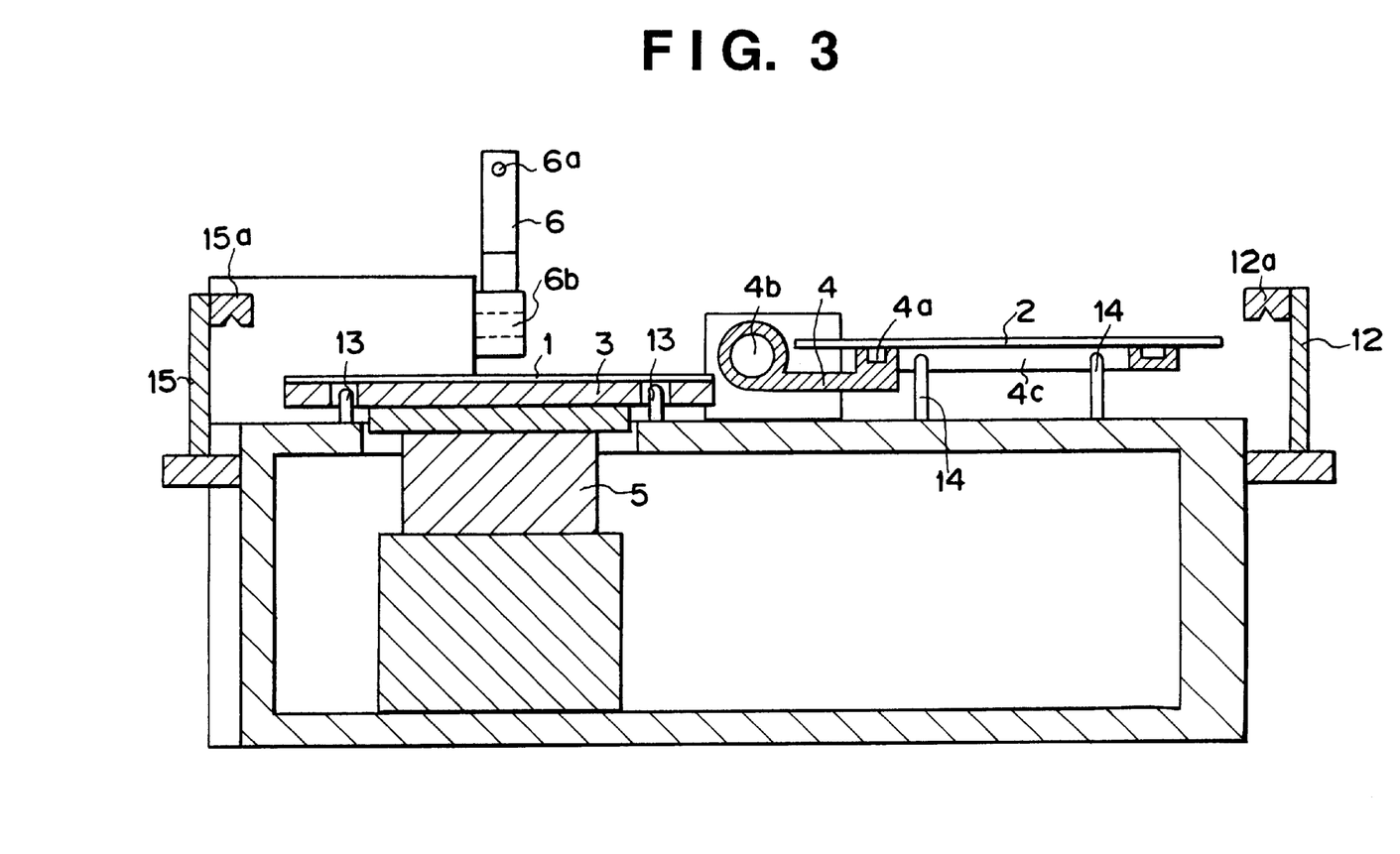
FIG. 3 is a sectional view of the wafer processing apparatus shown in FIGS. 1 and 2 taken along the line A –A'.

When the wafers 1 and 2 are respectively placed on the loading pins 13 and 14 by the wafer convey robot 10, the z-axis stage 5 moves up the wafer support table 3 to a predetermined position for supporting the wafer 1, and the wafer moving mechanism 4 pivots the wafer chuck portion 4c about the shaft 4b to a predetermined position where the wafer chuck portion 4c can chuck the wafer 2, as shown in FIG. 3.

Figure 4:
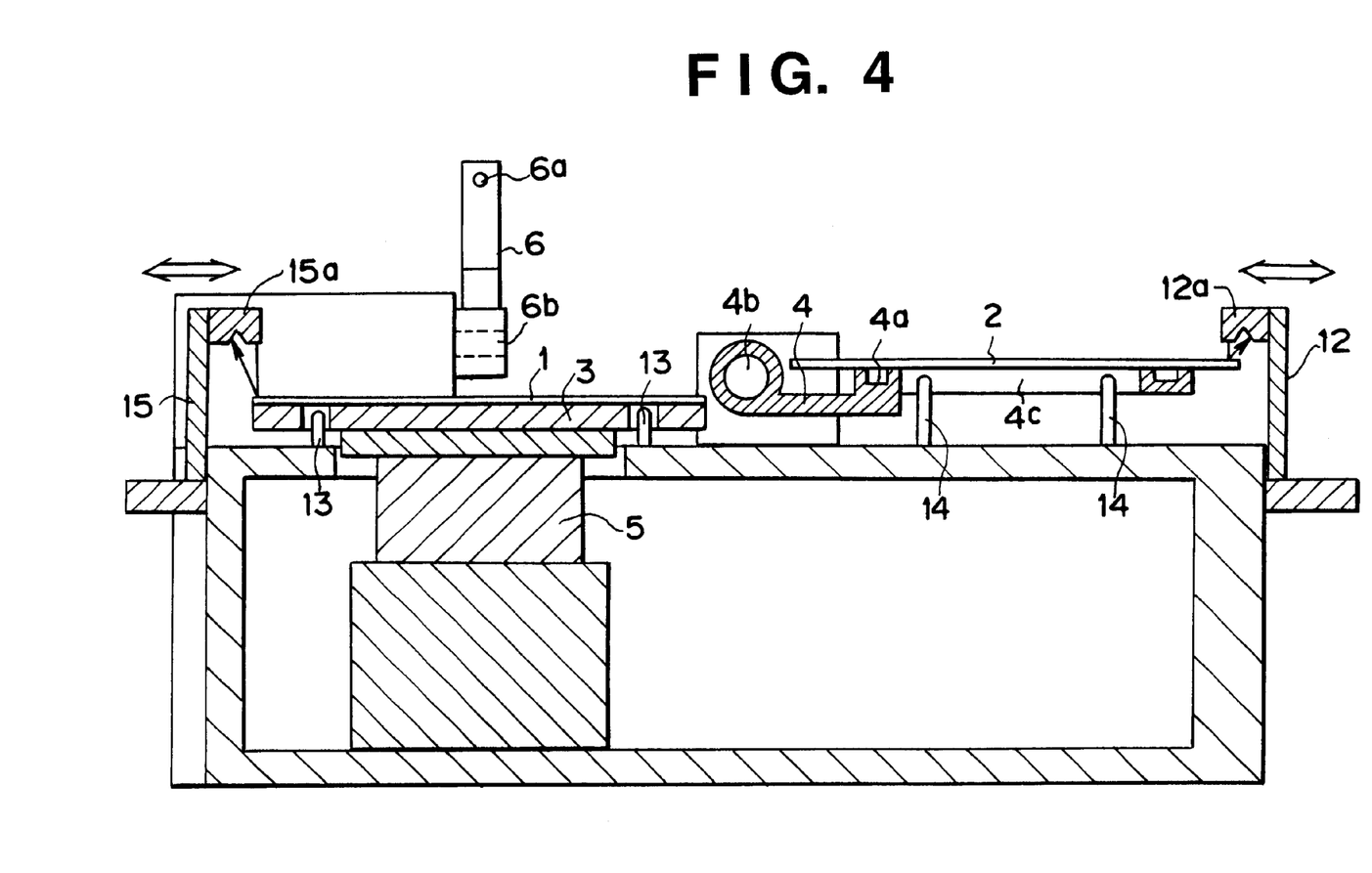
FIGS. 4 to 7 are sectional views of the wafer processing apparatus shown in FIGS. 1 and 2 taken along the line A–A', which show the operation of the wafer processing apparatus in contacting two wafers.

As shown in FIG. 4, the sensors 15a and 12a of the displacement detecting portions 15 and 12 move to portions above the wafers 1 and 2 to respectively measure the thicknesses of the wafers 1 and 2. Upon completion of the measurement of the thicknesses of the wafers 1 and 2, the sensors 15a and 12a return to the initial positions shown in FIG. 3.

Figure 5:
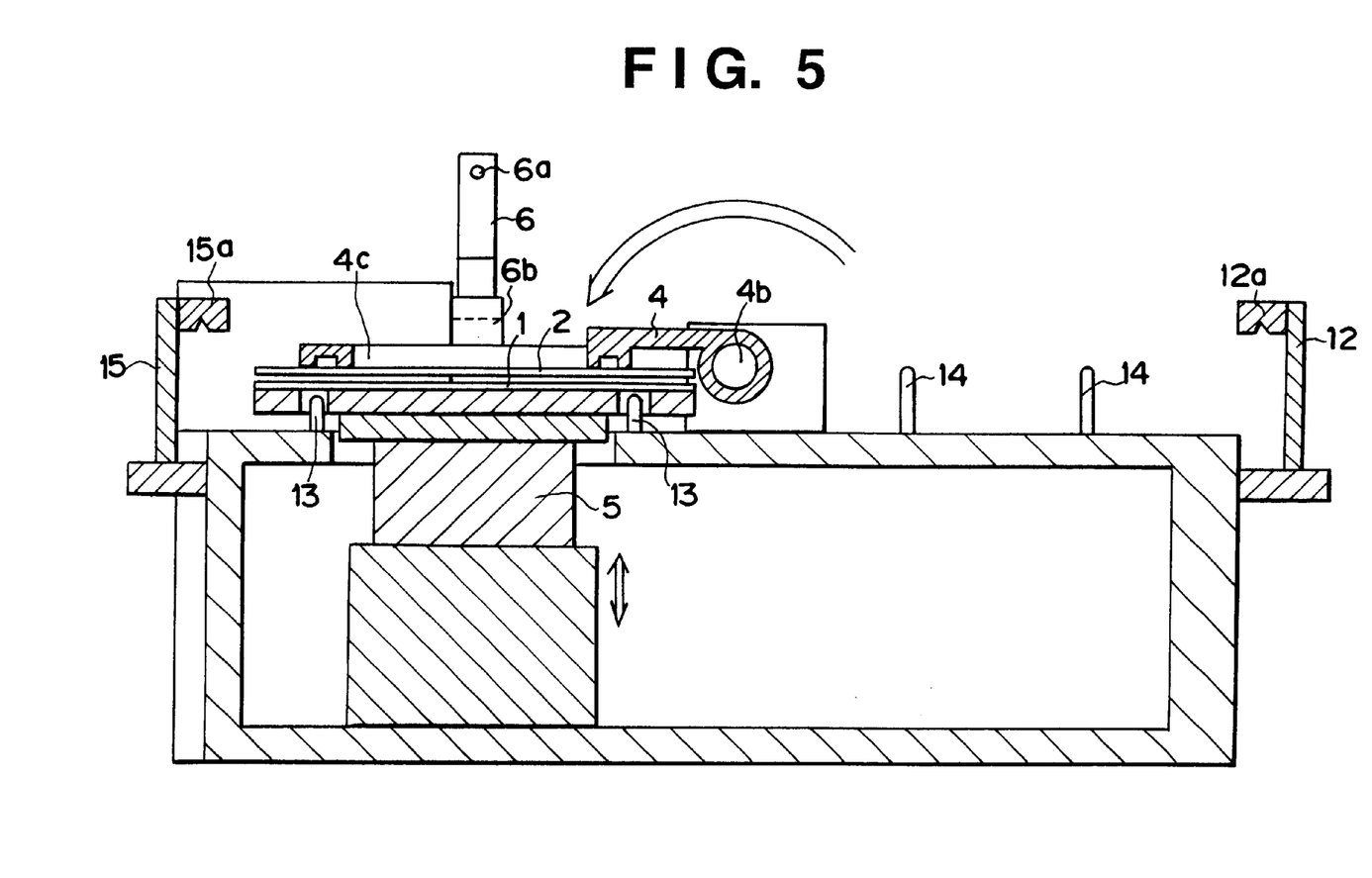

As shown in FIG. 5, the wafer moving mechanism 4 pivots the wafer chuck portion 4c about the shaft 4b through about 180° to make the wafers 1 and 2 face each other substantially parallel. On the basis of the measured thicknesses of the wafers 1 and 2, the level of the wafer support table 3 is adjusted by the z-axis stage 5 to set the gap between the wafers 1 and 2 to a set value. This gap is preferably about 20 to 100 mm and more preferably about 30 to 60 mm.

Figure 6:
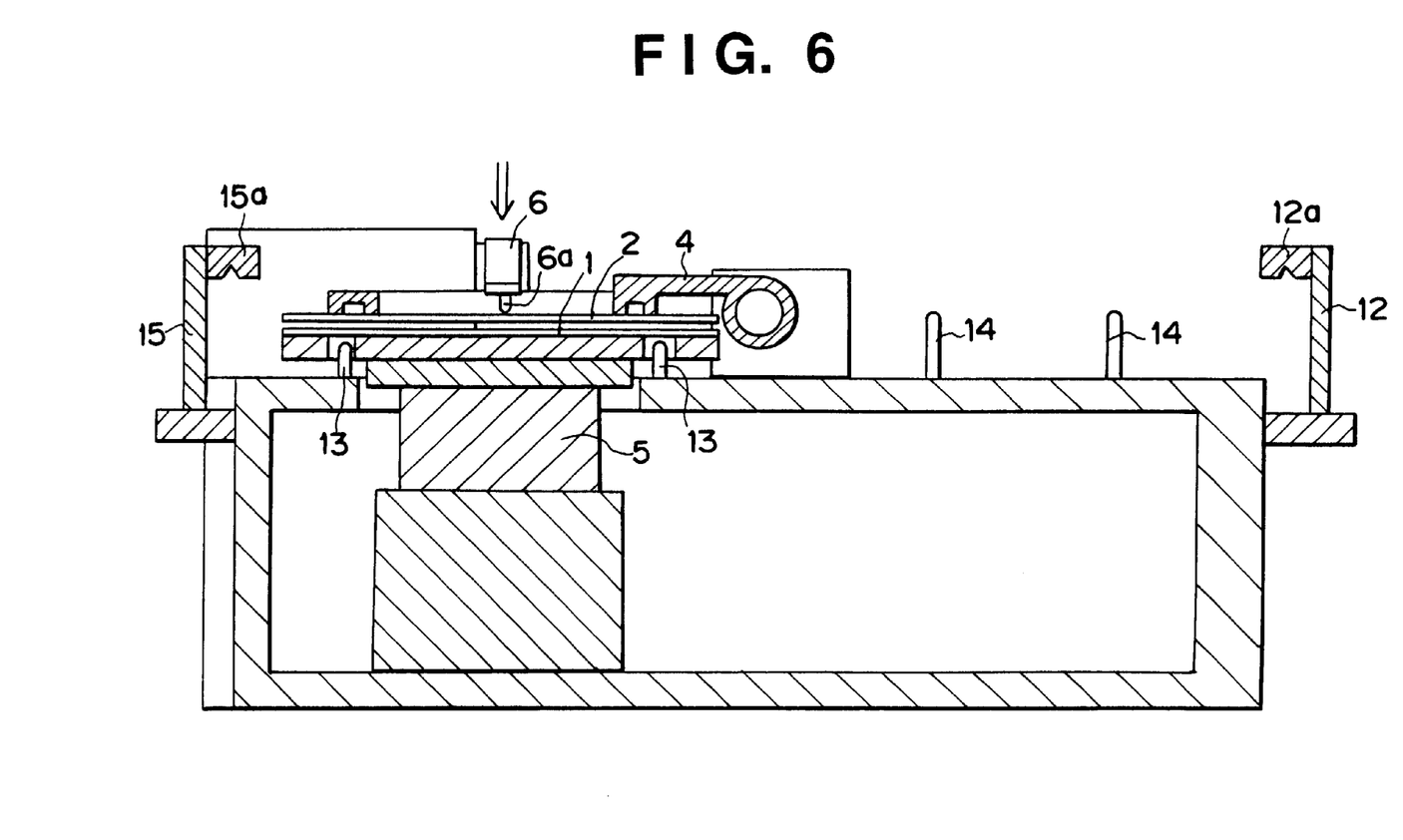

As shown in FIG. 6, the press pin 6a is pivoted about the shaft 6b to a portion near the backside of the wafer 2 (e.g., a position where the press pin 6a substantially contacts the backside of the wafer 2).

Figure 7:
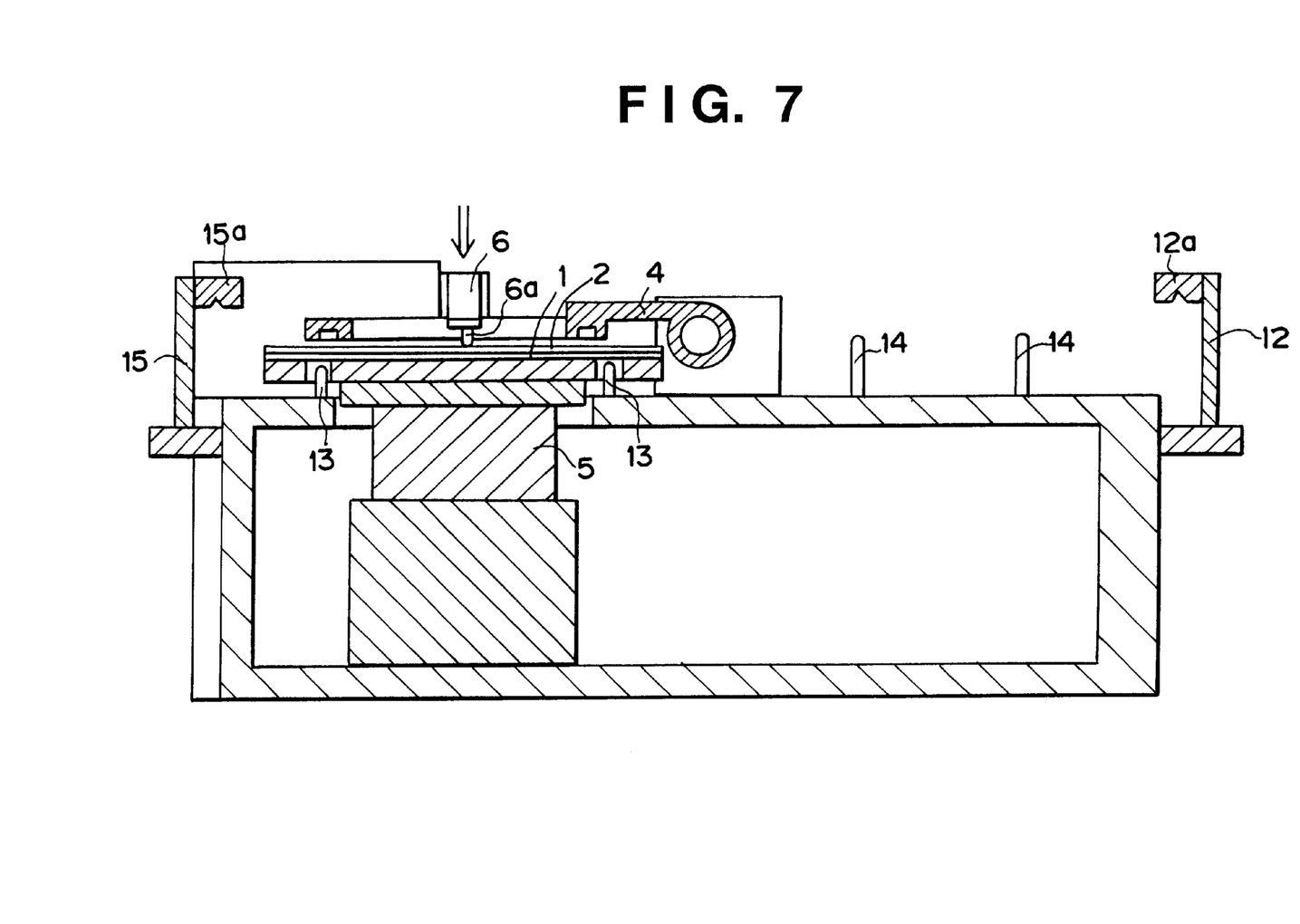

As shown in FIG. 7, the backside of the wafer 2 is pressed by the press pin 6a in response to cancel of the chucking of the wafer 2 by the wafer chuck portion 4c. At this time, the press pin 6a can be vibrated to efficiently discharge the gas between the wafers 1 and 2.

After the press mechanism 6 returns to the original state (state shown in FIG. 2), the wafer chuck portion 4c returns to the original state (state shown in FIG. 2). The wafer support table 3 is moved down to support the contacted wafer by the loading pins 13. In this state, the wafer convey robot 10 chucks the lower portion of the contacted wafer, conveys the wafer to the wafer cassette 9, and stored it therein.

Figure 8:
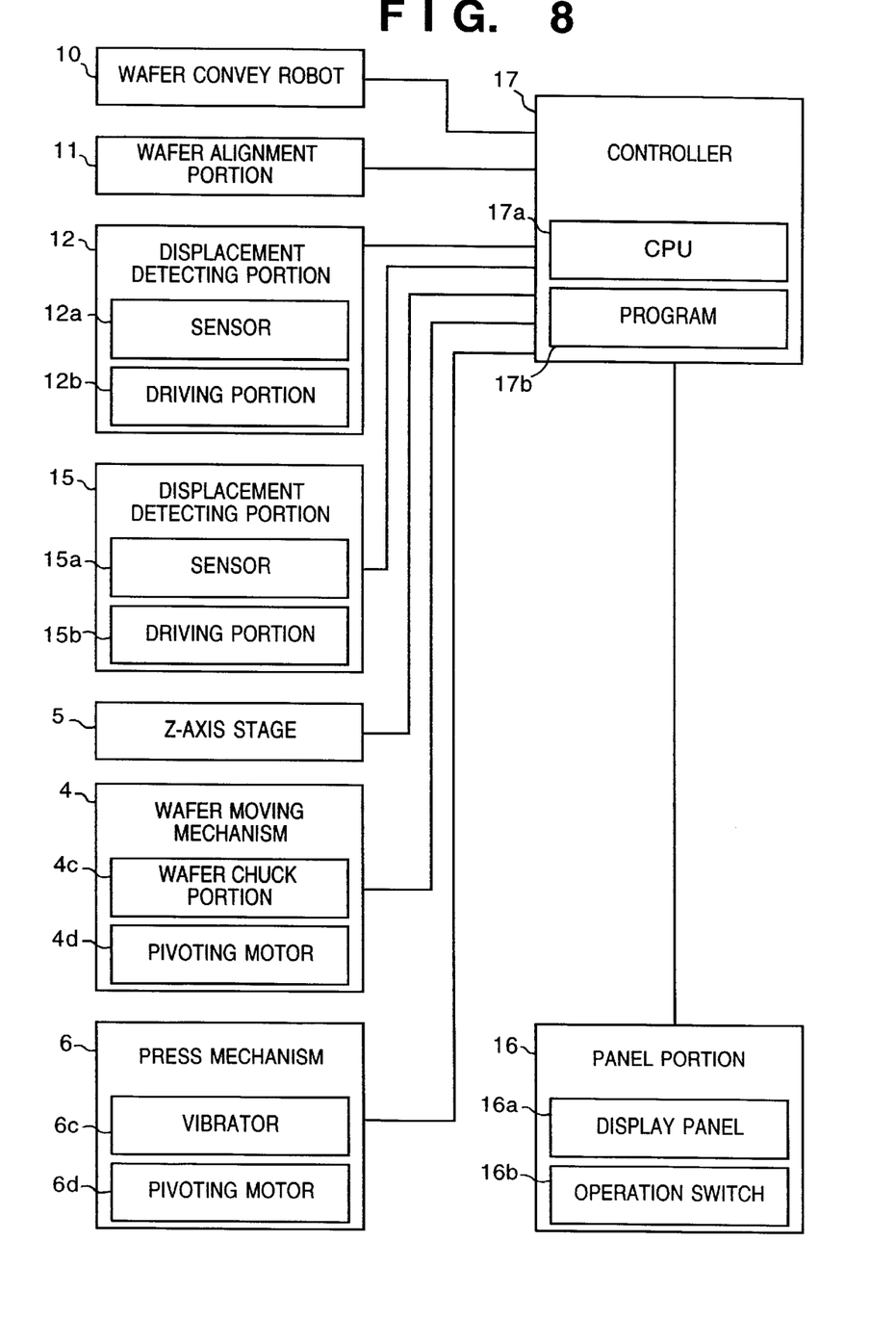
FIG. 8 is a block diagram showing an example of the arrangement of the control system of the wafer processing apparatus.

An example of the arrangement of the control system of the wafer processing apparatus 100 will be described with reference to FIG. 8. A controller 17 controls the wafer convey robot 10, the wafer alignment portion 11, the displacement detecting portions 12 and 15, the z-axis stage 5, the wafer moving mechanism 4, the press mechanism 6, and the operation panel 16 by using a CPU 17a which operates based on a program 17b.

Figure 9:
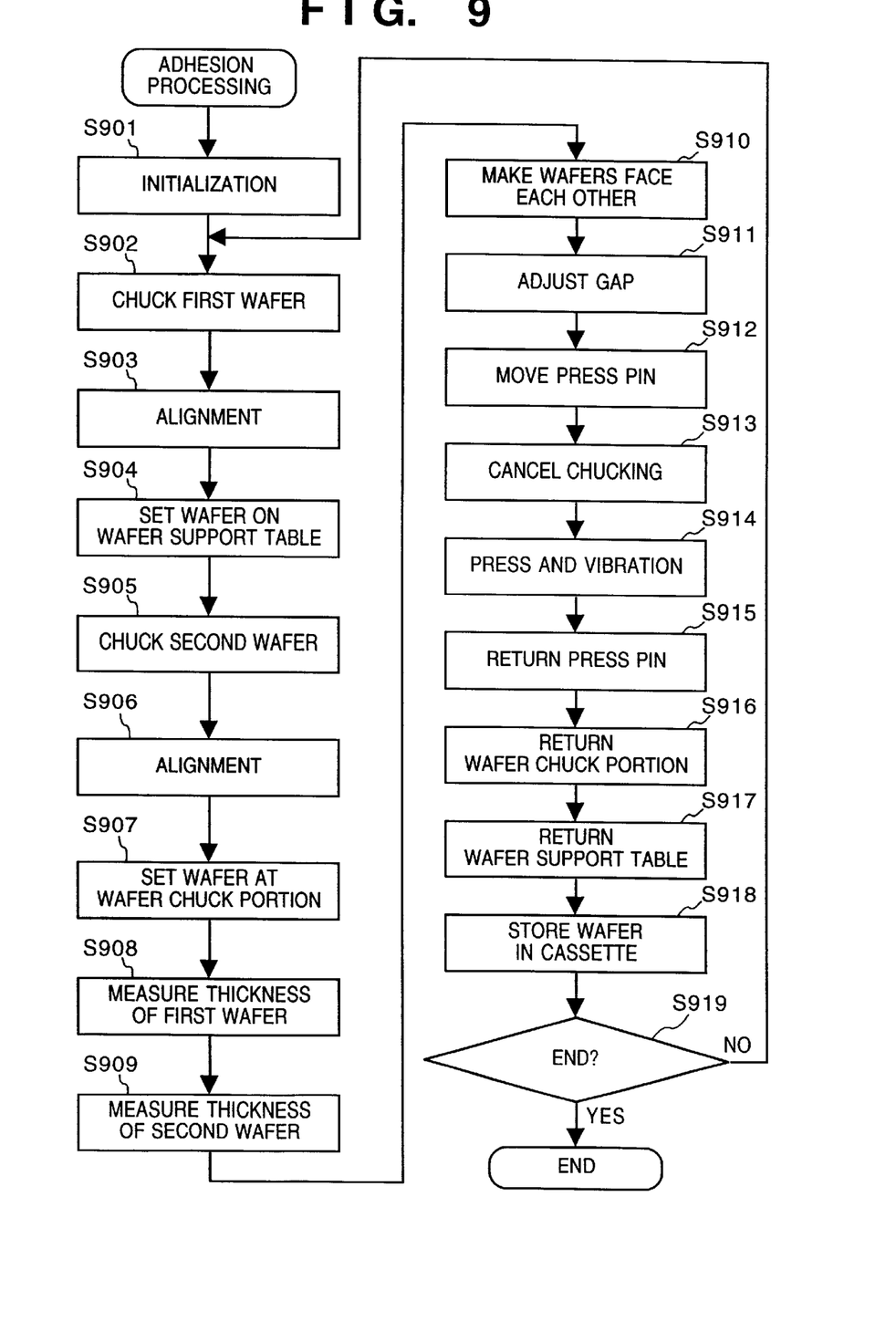
FIG. 9 is a flow chart showing the control procedure of the wafer processing apparatus.

FIG. 9 is a flow chart showing a control procedure based on the program 17b. The operation of the control system of the wafer processing apparatus 100 will be explained with reference to this flow chart.

When the start of wafer contact process is instructed by operating the operation switch 16b, respective constituent elements connected to the controller 17 are initialized in step S901. In this initialization step, the presence of the positions of the wafer cassettes 7, 8, and 9, their positions, and the like are also confirmed. If the preparation has not been made yet, the operator is given a warning by displaying the warning on a display panel 16a.

In step S902, the wafer convey robot 10 is controlled to chuck the wafer 1 stored in the wafer cassette 7. In step S903, the chucked wafer 1 is conveyed to the wafer alignment portion 11, which adjusts the position (central position and direction) of the wafer 1. In step S904, the wafer convey robot 10 is controlled to place the wafer 1 at a predetermined position on the loading pins 13 projecting from the wafer support table 3. The z-axis stage 5 is controlled to move the wafer support table 3 to a predetermined position. At this time, when the wafer support table 3 comprises a wafer chuck mechanism, the chuck mechanism is controlled to chuck the wafer 1.

In step S905, the wafer convey robot 10 is controlled to chuck the wafer 2 stored in the wafer cassette 8. In step S906, the wafer 2 is conveyed to the wafer alignment portion 11, which adjusts the position (central position and direction) of the wafer 2. In step S907, the wafer convey robot 10 is controlled to place the wafer 2 at a predetermined position on the loading pins 14 projecting from the wafer chuck portion 4c. A pivoting motor 4d of the wafer moving mechanism 4 is controlled to pivot the wafer chuck portion 4c about the shaft 4b through a predetermined angle, thereby chucking the wafer 2 by the wafer chuck portion 4c.

In step S908, a driving portion 15b of the displacement detecting portion 15 is controlled to move the sensor 15a to a predetermined position above the wafer 1. The thickness of the wafer 1 is measured using the sensor 15a.

In step S909, a driving portion 12b of the displacement detecting portion 12 is controlled to move the sensor 12a to a predetermined position above the wafer 2. The thickness of the wafer 2 is measured using the sensor 12a.

In step S910, the pivoting motor 4d of the wafer moving mechanism 4 is controlled to pivot the wafer chuck portion 4c about the shaft 4b through about 180°, thereby making the wafers 1 and 2 face each other substantially parallel.

In step S911, data for adjusting the gap between the wafers 1 and 2 to a set value is generated on the basis of the measurement results of the thicknesses of the wafers 1 and 2. The z-axis stage 5 is controlled based on this data to adjust the gap between the wafers 1 and 2.

In step S912, a pivoting motor 6d of the press mechanism 6 is controlled to pivot the press pin 6a about the shaft 6b, thereby bringing the tip of the press pin 6a into substantial contact with the backside of the wafer 2.

In step S913, the chucking of the wafer 2 by the wafer chuck portion 4c is canceled. In step S914, the pivoting motor 6d and a vibrator 6c of the press mechanism 6 are controlled to press the backside of the wafer 2 by the press pin 6a, and vibrate the press pin 6a. By executing step S914 immediately after S913, the cancel of the chucking of the wafer 2 and the press of the wafer 2 can be substantially simultaneously performed. Note that the press of the wafer 2 can start, e.g., upon the lapse of a predetermined time after executing step S914.

In step S915, after the wafers 1 and 2 are contacted, the pivoting motor 6d of the press mechanism 6 is controlled to return the press pin 6a to the initial position. In step S916, the pivoting motor 4d of the wafer moving mechanism 4 is controlled to return the wafer chuck portion 4c to the initial position.

In step S917, the z-axis stage 5 is controlled to move down the wafer support table 3 to the initial position. As a result, the contacted wafer is supported by the loading pins 13. When the second wafer 2 is chucked, this chucking must be canceled prior to the downward movement of the wafer support table 3.

In step S918, the wafer convey robot 10 is controlled to convey the contacted wafer to the wafer cassette 9 and store it therein.

In step S919, whether all wafers stored in the wafer cassettes 7 and 8 have been contacted is checked. If NO in step S919, the flow returns to step S902 to repeatedly perform the above processing. If YES in step S919, the series of processes have been completed. At this time, the end of the processing is preferably notified to the operator by displaying this on the display panel 16a or the like, or with a buzzer or the like.

As described above, according to the wafer processing apparatus 100, since 1) the press of the upper wafer 2 starts in response to the cancel of the chucking of the upper wafer 2, the gas between the wafers 1 and 2 can be reliably discharged toward the peripheral portion. Since 2) the upper wafer 2 does not slip while the wafers 1 and 2 face each other, the two wafers 1 and 2 can be accurately aligned. Since 3) the gap between the wafers 1 and 2 can be adjusted to a proper distance, the quality of a manufactured wafer can be made uniform. In addition, the wafer processing apparatus 100 does not require any operation of classifying the wafers 1 and 2 in advance. 4) The frontsides of the wafers 1 and 2 can be prevented from being contaminated by particles. 5) The peripheral portion of the wafer can be prevented from chipping. 6) The gas left between the wafers can be further discharged by vibrating the wafers in pressing them.

An example of the application of the wafer processing apparatus 100 will be described. FIGS. 10A to 10F are views showing an example of a process of manufacturing a wafer having an SOI structure or the like.

Figure 10A:
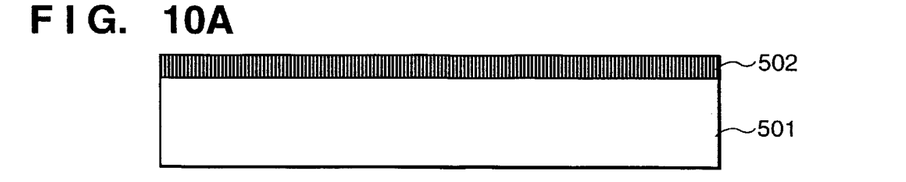
Figure 10B:
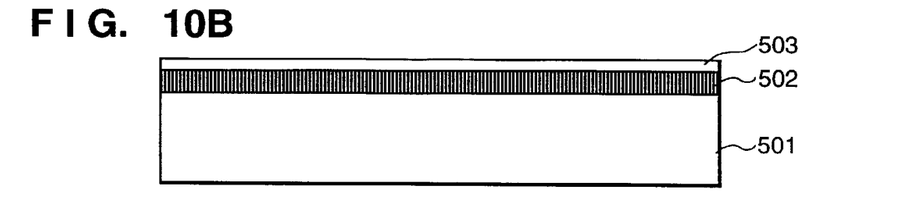

A single-crystal Si wafer 501 for forming the first wafer 1 is prepared, and a porous Si layer 502 is formed on the major surface of the single-crystal Si wafer 501 (see FIG. 10A). At least one unporous layer 503 is formed on the porous Si layer 502 (see FIG. 10B). Preferable examples of the unporous layer 503 are a single-crystal Si layer, a poly-Si layer, an amorphous Si layer, a metal layer, a compound semiconductor layer, and a superconductive layer. An element such as a MOSFET may be formed on the unporous layer 503.

Figure 10C:
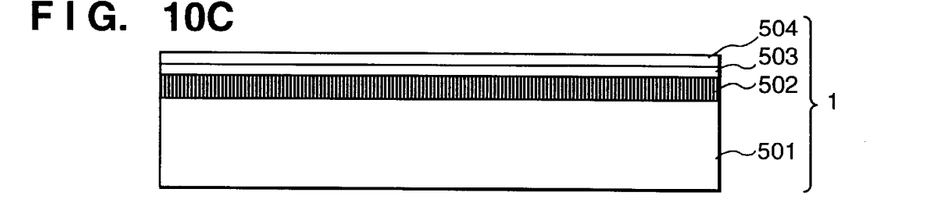

An SiO2 layer 504 is formed on the unporous layer 503, and the obtained structure is used as the first wafer 1 (see FIG. 10C). The first wafer 1 is stored in the wafer cassette 7 with the SiO2 layer 504 facing upward.

The second wafer 2 is separately prepared, and stored in the wafer cassette 8 with its frontside facing upward.

In this state, the wafer processing apparatus 100 is operated. Then, the first and second wafers 1 and 2 are contacted on the wafer support table 3 so as to sandwich the SiO2 layer 504 between them (see FIG. 10D). The contacted wafer is stored in the wafer cassette 9.

Figure 10D:
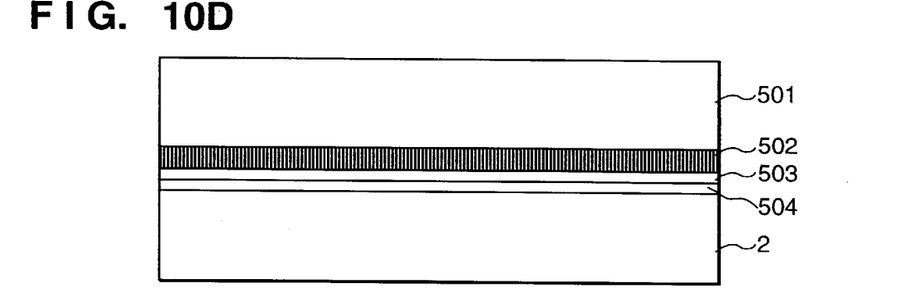
Figure 10E:
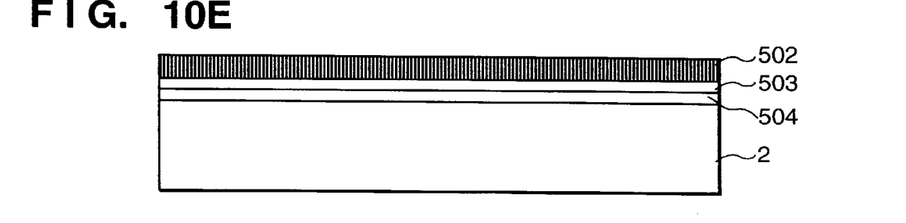

The contact of the wafers 1 and 2 may be strengthened by performing anode joining, press processing, annealing if needed, or a combination of them for the contacted wafer (FIG. 10D).

Preferable examples of the second wafer 2 are an Si wafer, a wafer prepared by forming an SiO2 layer on an Si wafer, a light-transmitting wafer such as a quartz wafer, and a sapphire wafer. The second wafer 2 suffices to have a satisfactorily flat surface to be contacted, and may be another kind of wafer.

Figure 10F:
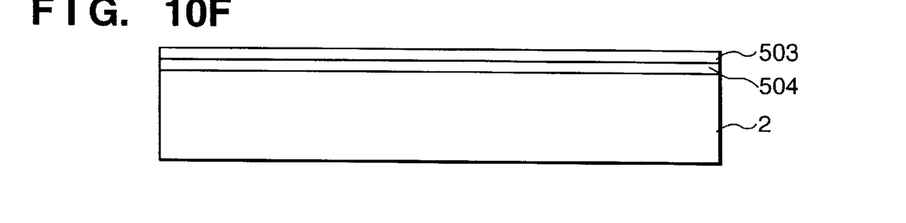

The first wafer 1 is removed from the second wafer 2 from the unporous layer 503 (see FIG. 10E)., and the porous Si layer 502 is selectively etched and removed. FIG. 10F schematically shows the wafer obtained by the above manufacturing method.

According to this manufacturing method, a high-quality wafer can be manufactured because two wafers are contacted while the gas between them is properly discharged.

According to the present invention, the quality of a substrate obtained by adhering two substrates can be increased.

The present invention is not limited to the above embodiments and various changes and modifications can be made within the spirit and scope of the present invention. Therefore, to apprise the public of the scope of the present invention the following claims are made.

What is claimed is:

1. A substrate processing apparatus for overlapping and contacting two substrates, characterized by comprising:

substrate operation means for supporting said two substrates to face each other, and then canceling the support of one substrate; and press means for pressing part of a backside of one substrate at substantially the same time as the cancel of the support of one substrate by said substrate operation means to superimpose one substrate on the other substrate.

2. The apparatus according to claim 1, characterized in that said substrate operation means substantially horizontally supports said two substrates, and then cancel the support of said upper substrate.

3. The apparatus according to claim 1, characterized in that said substrate operation means supports said two substrates respectively from only backsides.

4. The apparatus according to claim 1, characterized in that said substrate operation means comprises gap adjustment means for adjusting a gap between said two substrates immediately before the support of one substrate is canceled.

5. The apparatus according to claim 4, characterized in that said gap adjustment means adjusts the gap between said two substrates to a predetermined distance.

6. The apparatus according to claim 4, characterized in that said gap adjustment means comprises measurement means for measuring thicknesses of said two substrates, and adjusts the gap between said two substrates on the basis of measurement results.

7. The apparatus according to claim 1, characterized in that said press means comprises a pressure transfer member for pressing said substrate in contact with part of said substrate, and vibration means for vibrating said pressure transfer member.

8. The apparatus according to claim 7, characterized in that said vibration means vibrates said pressure transfer member in pressing said substrate.

9. The apparatus according to claim 1, characterized in that said substrate operation means comprises first substrate support means for supporting one substrate with a frontside of said substrate facing upward, and second substrate support means for chucking the other substrate from a backside, and supporting said substrate while making a frontside of said substrate face the frontside of one substrate substantially parallel.

10. The apparatus according to claim 9, characterized in that said second substrate support means comprises a chuck member for chucking the other substrate from the backside, and after the other substrate is chucked by said chuck member, pivots said chuck member through about 180° about a shaft arranged near a middle portion between said chuck member and said first substrate support means to turn over the other substrate chucked and make the other substrate face one substrate supported by said first substrate support means.

11. The apparatus according to claim 1, characterized by further comprising substrate convey means for conveying said substrates to reception positions of said substrates by said substrate operation means.

12. The apparatus according to claim 11, characterized by further comprising substrate adjustment means for adjusting central positions and directions of said substrates supported by said substrate operation means.

13. The apparatus according to claim 12, characterized in that said substrate adjustment means adjusts the central positions and directions of said substrates held by said substrate convey means, and then said substrate convey means conveys said substrates having the adjusted central positions and directions to the reception positions.

14. A substrate processing method of overlapping and contacting two substrates, characterized by comprising:

supporting said two substrates to face each other, then canceling the support of one substrate, pressing part of a backside of one substrate at substantially the same time as the cancel, and superimposing one substrate on the other substrate.

15. A substrate processing method of overlapping and contacting two substrates, characterized by comprising:

substantially horizontally supporting said two substrates to face each other, then canceling the support of an upper substrate of said two substrates, pressing part of said upper substrate at substantially the same time as the cancel of the support, and superimposing said upper substrate on said lower substrate.

16. The method according to claim 15, characterized in that said two substrates are respectively supported from only backsides.

17. The method according to claim 15, characterized in that a gap between said two substrates immediately before the support of said substrate is canceled is adjusted to a predetermined distance.

18. A substrate manufacturing method comprising the substrate processing method according to claim 15 in part of a process.

19. A contacting method of contacting two wafers by using a wafer processing apparatus having first and second wafer support tables and wafer alignment unit, the second wafer support table having a chucking mechanism, the method comprising steps of:

placing a first wafer which has been aligned by the wafer alignment unit on the first wafer support table;

placing a second wafer which has been aligned by the wafer alignment unit on the second wafer support table;

facing the fist and second wafers while chucking the second wafer by the chucking the second wafer by the chucking mechanism so that the second wafer is arranged above the first wafer; and contacting the first and second wafers.

* * * * *

UNITED STATES PATENT AND TRADEMARK OFFICE
CERTIFICATE OF CORRECTION

PATENT NO. : 6,309,505 B1  Page 1 of 1
DATED : October 30, 2001
INVENTOR(S) : Toru Takisawa et al.

It is certified that error appears in the above-identified patent and that said Letters Patent is hereby corrected as shown below:

Column 4,
Line 24, "and to superimposing" should read -- and superimposing --

Column 5,
Line 66, "pin 6aof" should read -- pin 6a of --

Column 8,
Line 10, "pin 6asubstantially" should read -- pin 6a substantially --

Signed and Sealed this

Fourth Day of June, 2002

*Attest:*

JAMES E. ROGAN
*Attesting Officer*  *Director of the United States Patent and Trademark Office*